(12) United States Patent
Harada

(10) Patent No.: US 12,200,985 B2
(45) Date of Patent: Jan. 14, 2025

(54) DISPLAY DEVICE IN WHICH THE OCCURRENCE OF SHADING IS REDUCED WITHOUT EXCESSIVELY INCREASING THE PIXEL SPACING

(71) Applicant: Japan Display Inc., Tokyo (JP)

(72) Inventor: Keisuke Harada, Tokyo (JP)

(73) Assignee: Japan Display Inc., Tokyo (JP)

( * ) Notice: Subject to any disclaimer, the term of this patent is extended or adjusted under 35 U.S.C. 154(b) by 438 days.

(21) Appl. No.: 17/378,836

(22) Filed: Jul. 19, 2021

(65) Prior Publication Data
US 2021/0343826 A1 Nov. 4, 2021

Related U.S. Application Data

(63) Continuation of application No. PCT/JP2019/043038, filed on Nov. 1, 2019.

(30) Foreign Application Priority Data

Jan. 25, 2019 (JP) .................................. 2019-010973

(51) Int. Cl.
H10K 59/131 (2023.01)
H10K 50/84 (2023.01)
H10K 59/121 (2023.01)

(52) U.S. Cl.
CPC ......... H10K 59/131 (2023.02); H10K 50/841 (2023.02); H10K 59/121 (2023.02)

(58) Field of Classification Search
CPC .. H10K 59/131; H10K 50/841; H10K 59/121; H10K 59/124; H10K 50/822;
(Continued)

(56) References Cited

U.S. PATENT DOCUMENTS 8,729,794 B2* 5/2014 Hasegawa ............... H10K 59/12
313/504
8,747,177 B2* 6/2014 Fujioka ............... H10K 59/1315
313/506
(Continued)

FOREIGN PATENT DOCUMENTS

JP 2002-031855 A 1/2002
JP 2002-318556 A 10/2002
(Continued)

OTHER PUBLICATIONS

International Search Report mailed on Dec. 24, 2019 for the PCT Application No. PCT/JP2019/043038, with English machine translation.

*Primary Examiner* — Kimberly N Rizkallah
*Assistant Examiner* — Pratiksha Jayant Lohakare
(74) *Attorney, Agent, or Firm* — Michael Best & Friedrich LLP

(57) ABSTRACT

The display device comprises a plurality of pixels each including a plurality of first electrodes; a second electrode formed on the plurality of first electrodes and common to the plurality of pixels; and a routing wiring formed in the same layer as the first electrode, wherein the routing wiring includes a line portion extending in a first direction between the adjacent pixels, and an extension portion extending in a second direction from the line portion toward at least one first electrode included in one of the adjacent pixels and in which the other first electrode of the one pixel is arranged in the first direction, and a part of the second electrode is in physical contact with the extension portion to be electrically connected to the routing wiring.

2 Claims, 15 Drawing Sheets

(58) Field of Classification Search
CPC ...... H10K 59/00; H10K 59/1315; G09F 9/30;
H05B 33/12; H05B 33/26
USPC .......................................................... 257/40
See application file for complete search history.

(56) References Cited

U.S. PATENT DOCUMENTS

| | | |
|---|---|---|
| 2002/0158835 A1 | 10/2002 | Kobayashi et al. |
| 2009/0102753 A1 | 4/2009 | Yamashita et al. |
| 2010/0244664 A1 | 9/2010 | Fujioka et al. |
| 2012/0086328 A1 | 4/2012 | Fujioka et al. |
| 2012/0175647 A1* | 7/2012 | Yamashita ........... H10K 50/824 |
| | | 257/E33.012 |
| 2013/0210312 A1 | 8/2013 | Fujioka et al. |
| 2014/0111404 A1* | 4/2014 | Omata ..................... G09G 3/32 |
| | | 345/76 |
| 2014/0217388 A1 | 8/2014 | Yamashita et al. |
| 2014/0340289 A1 | 11/2014 | Yamashita et al. |
| 2017/0154946 A1 | 6/2017 | Ono |
| 2017/0278869 A1* | 9/2017 | Hiramatsu ........ H01L 29/78675 |
| 2018/0286889 A1* | 10/2018 | Yamaguchi ......... H01L 27/1225 |
| 2019/0067334 A1* | 2/2019 | Yamaguchi ........... H01L 27/127 |
| 2019/0172391 A1 | 6/2019 | Yamashita et al. |
| 2021/0183985 A1* | 6/2021 | Lim .................... G09G 3/3208 |

FOREIGN PATENT DOCUMENTS

| | | | |
|---|---|---|---|
| JP | 2006058814 A | * | 5/2006 |
| JP | 2009-122652 A | | 6/2009 |
| JP | 2012-230928 A | | 11/2012 |
| JP | 2016-085796 A | | 5/2016 |
| JP | 6311902 B2 | | 4/2018 |

* cited by examiner

DISPLAY DEVICE IN WHICH THE OCCURRENCE OF SHADING IS REDUCED WITHOUT EXCESSIVELY INCREASING THE PIXEL SPACING

CROSS-REFERENCE TO RELATED APPLICATION

The present application is Bypass Continuation of International Application No. PCT/JP2019/043038, filed on Nov. 1, 2019, which claims priority from Japanese Application No. JP2019-010973 filed on Jan. 25, 2019. The contents of these applications are hereby incorporated by reference into this application.

BACKGROUND OF THE INVENTION

1. Field of the Invention

The present invention relates to a display device.

2. Description of the Related Art

In recent years, a display device such as an organic electroluminescence (EL) display device or a liquid crystal display device includes an individual electrode formed for each pixel and a common electrode formed over a plurality of pixels and applies the potentials of individual electrodes to each pixel with respect to the potentials applied to the common electrode, thereby making pixels emit light.

Here, for example, when the screen size is large, the electric resistance of the common electrode becomes large, which may cause a problem of shading in which the brightness of the central area is lower than that of the outer peripheral area of the screen.

In this regard, JP 2002-318556 A describes an active matrix type flat display device in which a plurality of scanning signal lines arranged on a substrate, a plurality of video signal lines arranged substantially orthogonal to the scanning signal lines, a switching element arranged in the vicinity of these intersections, and a display element connected to the switching element and provided with an optical modulation layer formed in an independent island shape between a first electrode and a second electrode are arranged in a matrix, in which the flat display device is provided with an auxiliary wiring, which is formed in the same layer as the first electrode, electrically insulated from the first electrode, and electrically connected to the second electrode, and the auxiliary wiring and the second electrode are electrically connected to each other via a contact portion provided on the partition wall between the pixels so as to expose the auxiliary wiring.

Further, in order to solve the problem in above-mentioned JP 2002-318556 A that the manufacturing process is complicated by directly connecting the auxiliary electrode and the second electrode, the Japanese Patent No. 6311902 discloses a display device which includes a display unit in which pixels having light emitting elements and circuit elements for driving the light emitting elements are arranged in a matrix, and a power supply unit that supplies a power supply voltage to the pixels from a power supply line arranged in an outer peripheral area of the display unit, wherein the pixel includes a first electrode formed on a drive circuit board on which the circuit element is formed, an auxiliary wiring formed on the drive circuit board so as to be separated from the first electrode, a light emitting layer formed above the first electrode and containing a light emitting substance, a second electrode formed above the light emitting layer, and an intermediate layer interposed between the first electrode and the second electrode, and the intermediate layer and the second electrode are extended from above the first electrode to above the auxiliary wiring, and the resistance value $R_{ip}$ of the intermediate layer on the auxiliary wiring satisfies the relationship of $R_{ip} \leq (R_{2p} - R_{bp}) \times M \times (M+1)/2$ where the pixel farthest from the power supply line is a first pixel arranged in the M-th pixel from the power supply line, the resistance value of the second electrode per pixel is $R_{2p}$, and the resistance value of the auxiliary wiring per pixel is $R_{bp}$.

Further, for the purpose of preventing the upper electrode from peeling off from the organic layer, JP 2016-085796 A discloses an organic EL display device including an organic layer which includes two adjacent pixels, a bank layer including a bank partitioning the two adjacent pixels, and a light emitting layer and has a portion formed on the bank layer and located on the upper surface of the bank; and at least one layer which includes a conductive layer functioning as an upper electrode on the organic layer and is formed above the organic layer, wherein the at least one layer includes a connecting portion that penetrates the portion of the organic layer located on the upper surface of the bank to be connected to the bank.

SUMMARY OF THE INVENTION

However, as described in JP 2002-318556 A, in order to directly connect the auxiliary electrode and the common electrode between the pixels, it is necessary to secure an area sufficiently wide for the connection between the pixels. As a result, there is a problem that the pixel spacing increases and the pixel density decreases.

The present invention has been made in view of the above problems and an object of the present invention is to provide a display device in which the occurrence of shading is reduced without excessively increasing the pixel spacing.

The display device according to one embodiment of the present invention comprises a plurality of pixels each including a plurality of first electrodes; a second electrode formed on the plurality of first electrodes and common to the plurality of pixels; and a routing wiring formed in the same layer as the first electrode, wherein the routing wiring includes a line portion extending in a first direction between the adjacent pixels, and an extension portion extending in a second direction from the line portion toward at least one first electrode included in one of the adjacent pixels and in which the other first electrode of the one pixel is arranged in the first direction, and a part of the second electrode is in physical contact with the extension portion to be electrically connected to the routing wiring.

DETAILED DESCRIPTION OF THE INVENTION

Figure 1:
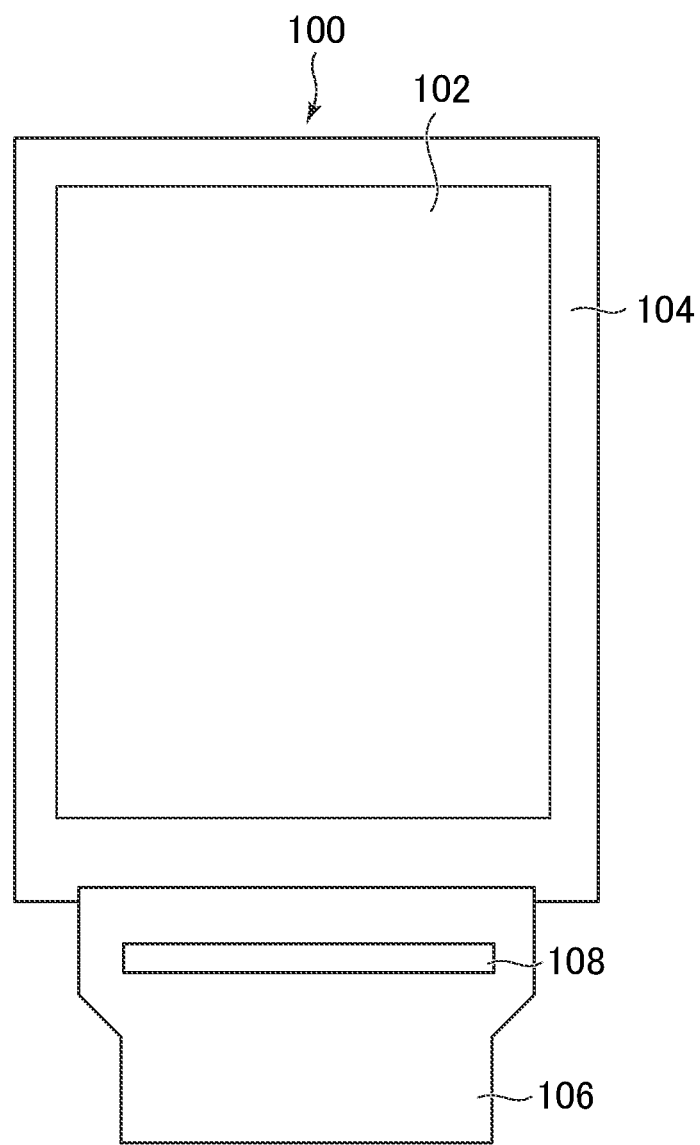
FIG. 1 is a schematic diagram schematically showing a display device according to an embodiment of the present invention in a plan view.

Hereinafter, each embodiment of the present invention will be described with reference to the drawings. The disclosure in the present specification is merely an example, and what can be easily conceived with an appropriate modification by those skilled in the art while maintaining the gist of the invention is naturally included in the scope of the present invention.

In order to clarify the description, the drawings may schematically represent the width, thickness, shape, or the like of each part as compared with the actual embodiment, but this is merely an example and does not limit the interpretation of the present invention. Further, in the present specification and each drawing, the same elements as those described previously with respect to the previously-mentioned drawings may be designated by the same reference numerals and the detailed description thereof may be omitted as appropriate. In addition, when a reference numeral including a number and an alphabet does not need to be distinguished by the alphabet, the alphabet may be omitted and the reference numeral is indicated only by the number.

Further, in the present specification, when defining the positional relationship between a certain constituent and another constituent, "above" and "below" are used not only when the another constituent is located directly above and directly below the certain configuration, respectively, but also when yet another constituent is interposed between the certain constituent and the another constituent, unless otherwise specified.

FIG. 1 is a diagram schematically showing an example of a display device 100 according to the present embodiment in a plan view. In the present embodiment, an example in which the display device 100 is a top emission type organic EL display device will be described.

The display device 100 includes a display area 102 and a frame area 104. The display area 102 includes a plurality of pixels 200 (see FIG. 3A) arranged in a matrix. Each pixel 200 includes an opening 230 (see FIG. 3A). Each pixel 200 emits light through the opening 230.

Figure 3A:
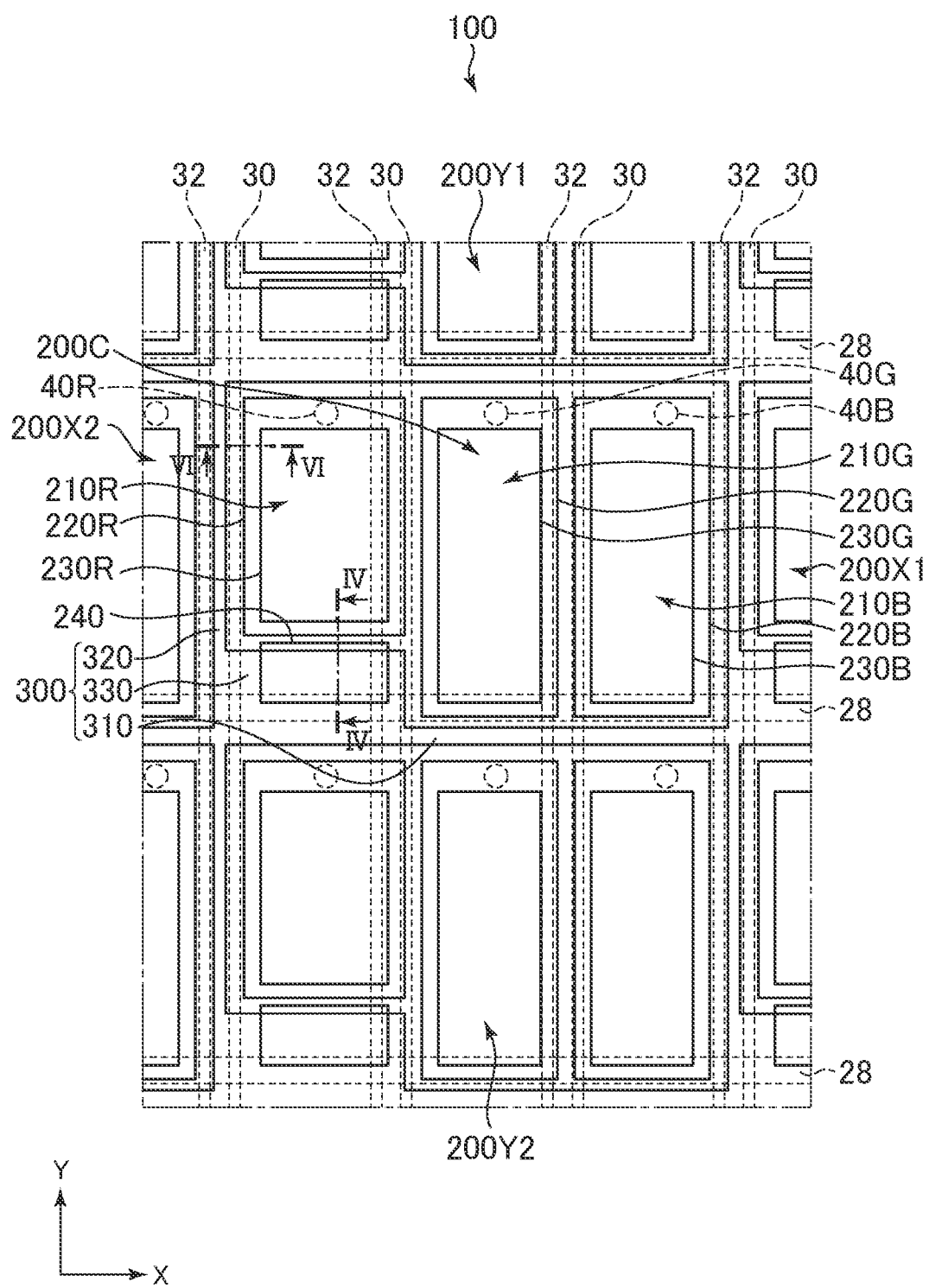
FIG. 3A is a schematic diagram schematically showing an example of the shape and arrangement of a first electrode and a routing wiring in the display area of the display device according to the embodiment of the present invention in a plan view.

Each pixel 200 includes a plurality of sub-pixels 210 (see FIG. 3A). That is, in the present embodiment, each pixel 200 includes a plurality of sub-pixels 210 that emit light in different colors. Specifically, each pixel 200 includes a first sub-pixel 210R that emits red light, a second sub-pixel 210G that emits green light, and a third sub-pixel 210B that emits blue light (see FIG. 3A).

When each pixel 200 includes the plurality of sub-pixels 210, each sub-pixel 210 has the opening 230. Therefore, each pixel 200 includes a plurality of openings 230 corresponding to the plurality of sub-pixels 210. Then, each sub-pixel 210 emits light from the opening 230 thereof.

The frame area 104 is an area surrounding the display area 102. In the example shown in FIG. 1, a flexible printed circuit board (FPC) 106 is connected to the frame area 104. For example, as shown in FIG. 1, the FPC 106 is equipped with a drive integrated circuit (IC) 108 for driving an element for displaying an image.

The drive IC 108 applies a potential for conducting between the source and drain with respect to a scanning signal line 28 (see FIG. 2) of the pixel transistor arranged corresponding to each of the plurality of sub-pixels 210 constituting one pixel 200 and passes a current corresponding to the gradation value of the sub-pixel 210 through a video signal line 30 (see FIG. 2) of each pixel transistor, for example.

Figure 2:
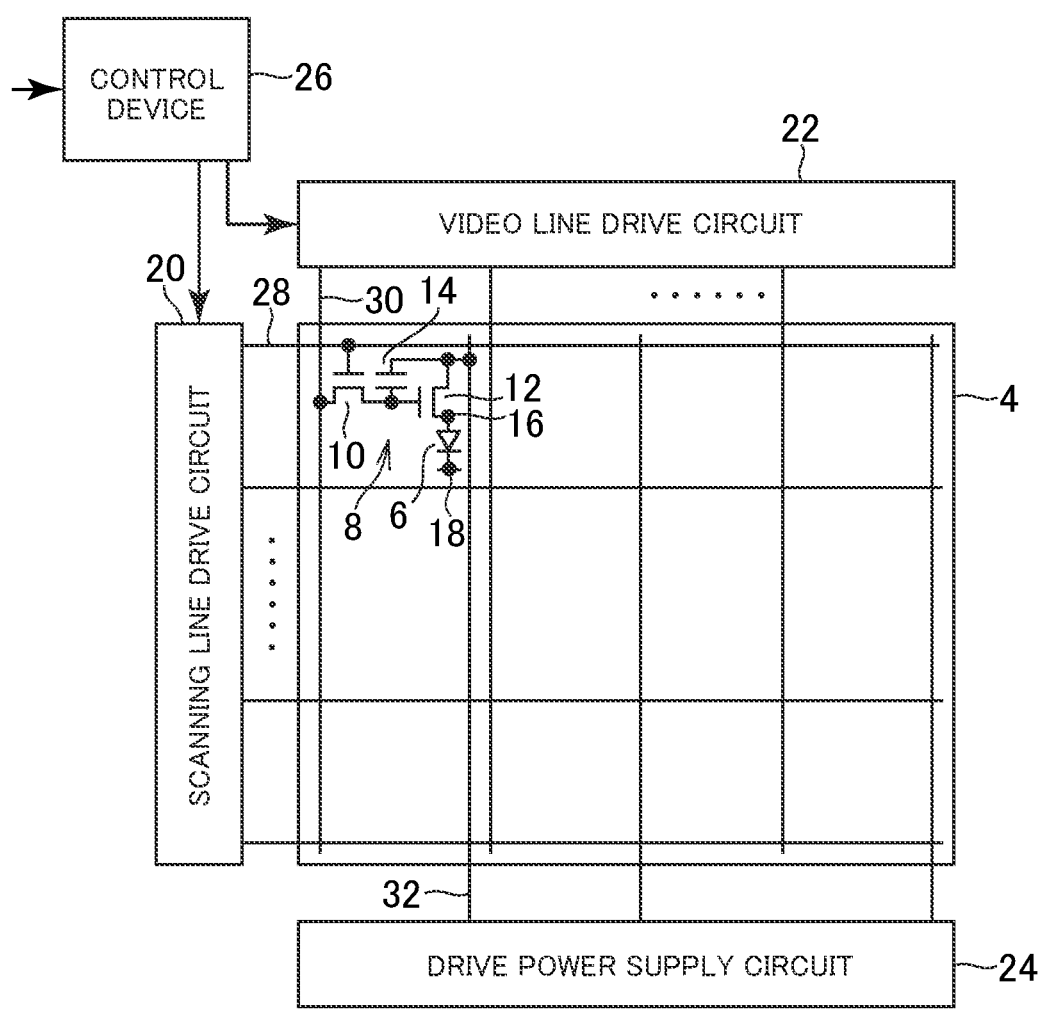
FIG. 2 is a circuit diagram of the display device according to the embodiment of the present invention.

FIG. 2 is a circuit diagram of the display device 100. The display device 100 includes a pixel array unit 4 for displaying an image and a drive unit for driving the pixel array unit 4. The pixel array unit 4 includes an organic light-emitting diode (OLED) 6 and a pixel circuit 8 provided corresponding to each sub-pixel 210.

The pixel circuit 8 includes a lighting thin film transistor (TFT) 10, a drive TFT 12, and a capacitor 14. The drive unit includes a scanning line drive circuit 20, a video line drive circuit 22, a drive power supply circuit 24, and a control device 26. The drive unit drives the pixel circuit 8 and controls the light emission of the OLED 6.

The scanning line drive circuit 20 is electrically connected to the scanning signal line 28 provided for each horizontal arrangement (sub-pixel row) of the sub-pixels 210. The scanning line drive circuit 20 sequentially selects the scanning signal line 28 according to a timing signal input from the control device 26 and applies a potential for turning on the lighting TFT 10 to the selected scanning signal line 28.

The video line drive circuit 22 is electrically connected to the video signal line 30 provided for each vertical arrangement (sub-pixel column) of the sub-pixels 210. The video line drive circuit 22 receives a video signal from the control device 26 and applies a potential corresponding to the video signal of the selected sub-pixel line according to the selection of the scanning signal line 28 by the scanning line drive circuit 20 to each video signal line 30. This potential is written to the capacitor 14 via the lighting TFT 10 at the selected sub-pixel row. The drive TFT 12 supplies the OLED 6 with a current corresponding to the written potential, whereby the OLED 6 of the sub-pixel 210 corresponding to the selected scanning signal line 28 emits light.

The OLED 6 includes an anode 16, a cathode 18, and an organic EL layer 400 (see FIGS. 4 and 6) formed between the anode 16 and the cathode 18. In the present embodiment, the anode 16 is formed as an individual electrode in each sub-pixel 210 and the cathode 18 is formed as a common electrode straddling the plurality of pixels 200.

The anode 16 is electrically connected to a drive power supply line 32 arranged for each sub-pixel row via the drive TFT 12. The drive power supply line 32 is electrically connected to the drive power supply circuit 24. The drive power supply circuit 24 applies a high potential to the anode 16 via the drive power supply line 32. That is, a potential based on the potential of the cathode 18 is applied to the anode 16.

The cathode 18 is electrically connected to a routing wiring 300 (see FIGS. 3A to 3E) used as the cathode power supply line. A low potential applied to the cathode 18 (a potential that serves as a reference for the potential to be applied to the anode 16) is supplied to the cathode power supply line, or the cathode power supply line is grounded. In the former case, the cathode power supply line is electrically connected to the drive power supply circuit 24 and the drive power supply circuit 24 applies a low potential to the cathode 18 via the cathode power supply line. A part of the cathode power supply line may be arranged in the frame area 104 (see FIG. 1).

The drive power supply circuit 24 supplies a current to the OLED 6 via the drive power supply line 32, the cathode power supply line (routing wiring 300), and the drive TFT 12 of the selected sub-pixel line. As a result, the organic EL layer 400 of the OLED 6 (see FIGS. 4 and 6) emits light.

Figure 3B:
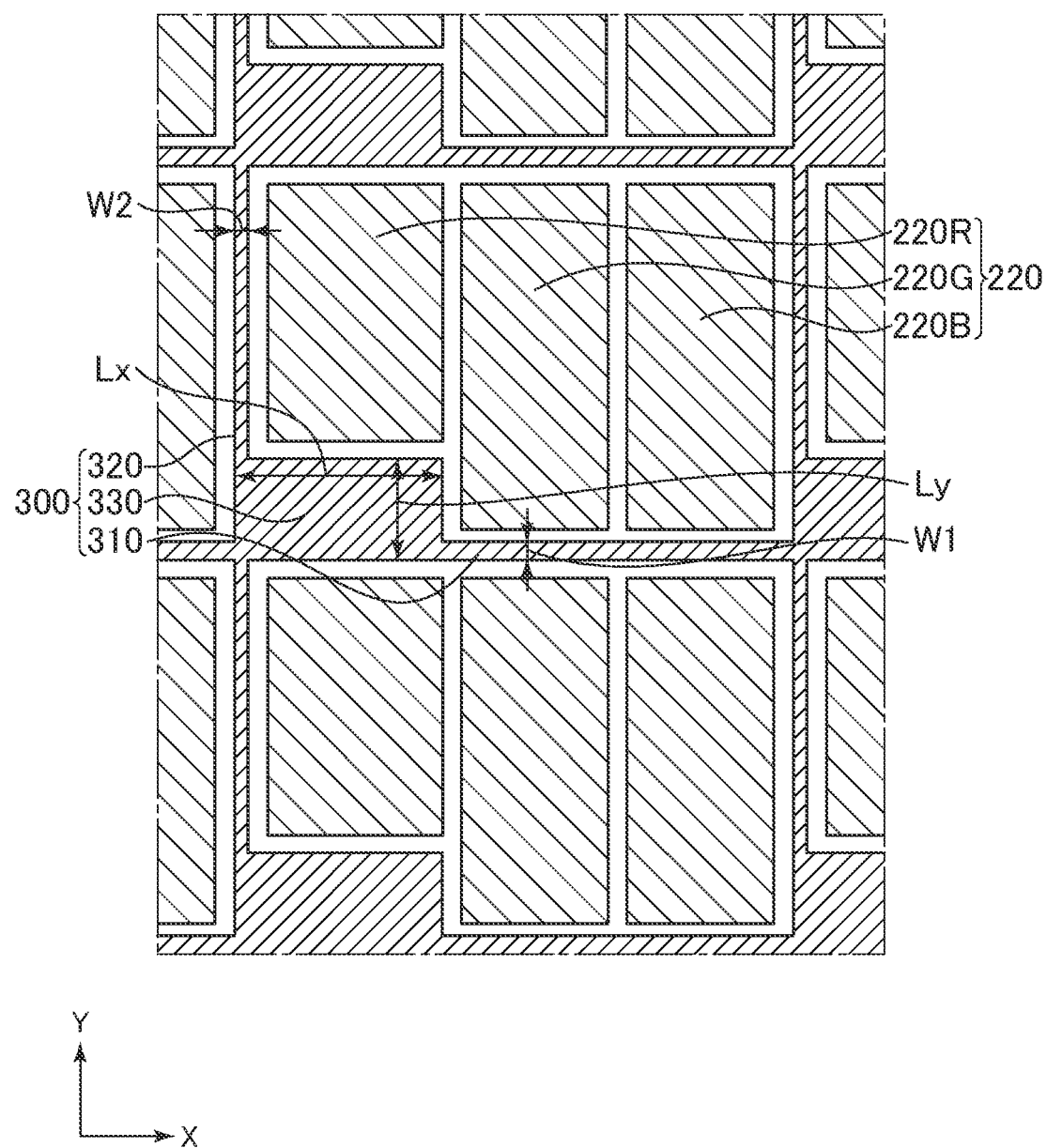
FIG. 3B is a schematic diagram showing the first electrode and the routing wiring shown in FIG. 3A extracted.
Figure 4:
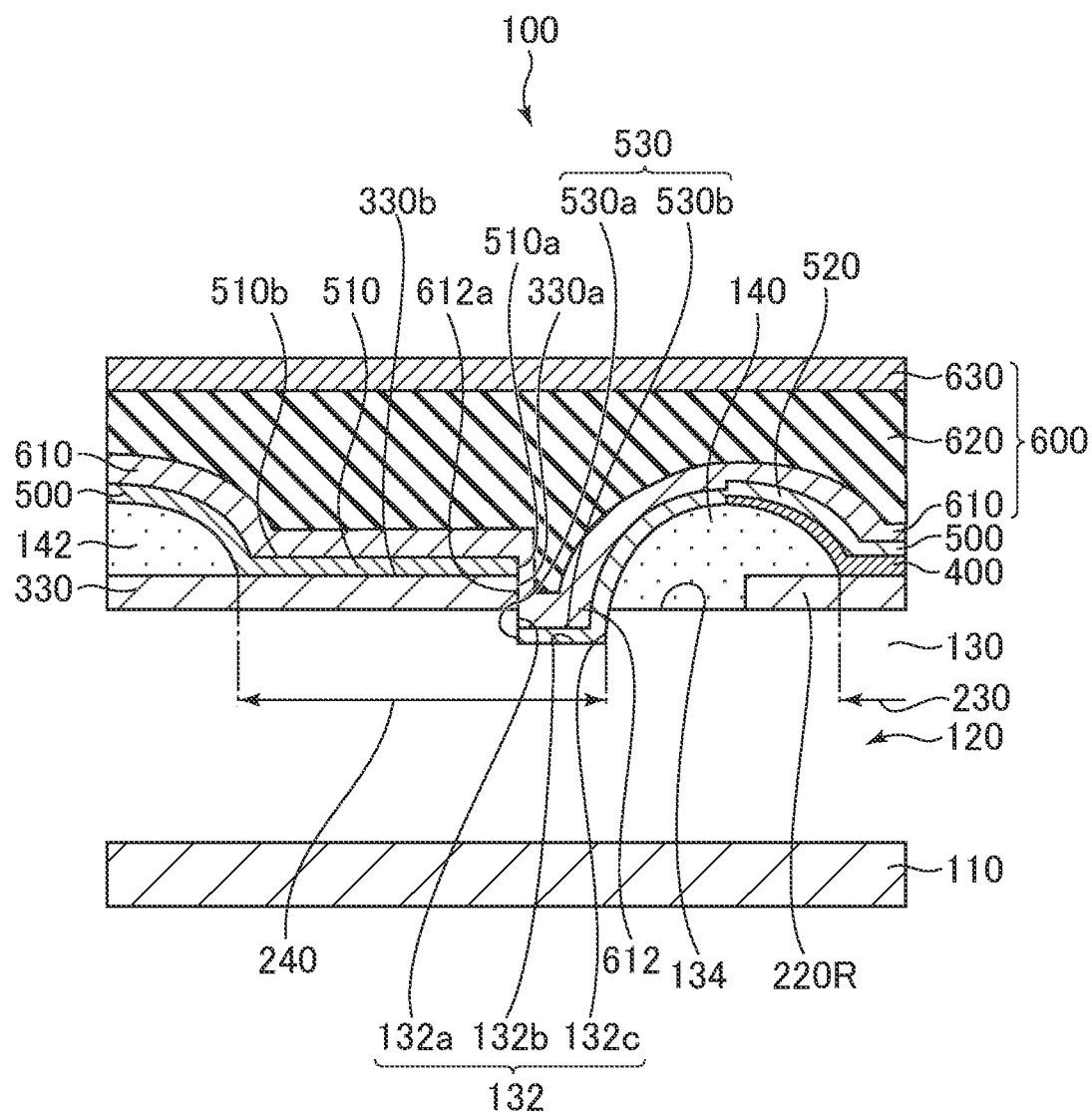
FIG. 4 is a schematic diagram schematically showing an example of a cross section of the display device cut along the IV-IV line shown in FIG. 3A.

FIG. 3A is a schematic diagram schematically showing the shape and arrangement of a first electrode 220 and the routing wiring 300 in the display area 102 (see FIG. 1) of the display device 100 in a plan view. FIG. 3B is a schematic diagram showing the first electrode 220 and the routing wiring 300 shown in FIG. 3A extracted for convenience of explanation. FIG. 4 is a schematic diagram schematically showing a cross section of the display device 100 cut along the IV-IV line shown in FIG. 3A.

The display device 100 includes the plurality of pixels 200. That is, focusing on one pixel 200C shown in the center of FIG. 3A, another pixel 200X1, and another pixel 200X2 are respectively arranged adjacent to the pixel 200C on one side and the other side in the X direction shown in the drawing of the pixel 200C. Another pixel 200Y1 and another pixel 200Y2 are respectively arranged adjacent to the pixel 200C on one side and the other side in the Y direction (direction orthogonal to the X direction) shown in the drawing of the pixel 200C. As described above, in the display area 102 (see FIG. 1) of the display device 100, the plurality of pixels 200 are arranged in a matrix.

Each pixel 200 includes the plurality of sub-pixels 210. That is, in the present embodiment, each pixel 200 includes three sub-pixels 210 that emit light in different colors. Specifically, for example, the pixel 200C shown in FIG. 3A includes the first sub-pixel 210R that emits red light, the second sub-pixel 210G that emits green light, and the third sub-pixel 210B that emits blue light. Then, in the display area 102 (see FIG. 1) of the display device 100, the plurality of sub-pixels 210 are also arranged in a matrix.

Each pixel 200 includes a plurality of first electrodes 220 corresponding to the plurality of sub-pixels 210. That is, for example, the pixel 200C shown in FIG. 3A includes a first electrode 220R of the first sub-pixel 210R, a first electrode 220G of the second sub-pixel 210G, and a first electrode 220B of the third sub-pixel 210B. As described above, each sub-pixel 210 includes the first electrode 220.

In the present embodiment, the first electrode 220 is formed as a lower electrode. That is, as shown in FIG. 4, the display device 100 includes a substrate 110 and a circuit layer 120 formed on the substrate 110, and the first electrode 220 is formed as a lower electrode on the circuit layer 120.

The circuit layer 120 includes a TFT that controls light emission in the organic EL layer 400 formed on the first electrode 220. That is, in the present embodiment, the circuit layer 120 includes the lighting TFT 10 and the drive TFT 12 (see FIG. 2). The circuit layer 120 also includes the capacitor 14 (see FIG. 2).

Specifically, the circuit layer 120 includes an insulating layer, a source electrode, a drain electrode, a gate electrode, and a semiconductor layer. A transistor is composed of a source electrode, a drain electrode, a gate electrode, and a semiconductor layer. The substrate 110 is made of, for example, glass or a resin material.

Then, the first electrode 220 is electrically connected to the TFT of the circuit layer 120. That is, the first electrode 220 is electrically connected to the source electrode or drain electrode of the transistor formed in the circuit layer 120 via a contact hole 40 formed in the circuit layer 120 (for example, a contact hole 40R of the first sub-pixel 210R, a contact hole 40G of the second sub-pixel 210G, and a contact hole 40B of the third sub-pixel 210B, in the pixel 200C shown in FIG. 3A).

In the present embodiment, the first electrode 220 is formed as the anode 16. Further, the first electrode 220 is formed as a reflective electrode. Specifically, the first electrode 220 has, for example, a three-layer laminated structure composed of ITO (Indium Tin Oxide), Ag, and ITO.

A rib 140 (see FIG. 4) is formed between adjacent first electrodes 220. The rib 140 is formed as a partition wall partitioning between adjacent sub-pixels 210. That is, in the example shown in FIG. 4, the rib 140 is formed from the portion between the adjacent first electrodes 220 to the outer peripheral portions of the first electrodes 220. That is, each first electrode 220 is formed with the rib 140 that covers the outer peripheral portion thereof.

The area surrounded by the rib 140 in each sub-pixel 210 is the opening 230 of each sub-pixel 210. That is, each of the plurality of sub-pixels 210 has the opening 230 surrounded by the rib 140. The rib 140 is made of an insulating material. Specifically, the rib 140 is made of an organic material such as photosensitive acrylic.

The organic EL layer 400 is formed on each of the first electrodes 220. The organic EL layer 400 includes a light emitting layer that emits light for displaying an image by the display device 100. The light emitting layer emits light by, for example, recombining holes injected from the anode 16 (see FIG. 2) and electrons injected from the cathode 18 (see FIG. 2).

The organic EL layer 400 may be a single layer composed of the light emitting layer or may be formed in multiple layers including other layers. Examples of the other layers include one or more selected from the group consisting of a hole injection layer, a hole transport layer, an electron transport layer, and an electron injection layer.

In the present embodiment, the organic EL layer 400 is formed for each sub-pixel 210. That is, as shown in FIG. 4, the organic EL layer 400 is formed so as to cover the central portion of the first electrode 220 that is not covered by the rib 140. In the example shown in FIG. 4, the organic EL layer 400 is formed so as to cover a part of the rib 140 surrounding the first electrode 220. However, in the example shown in FIG. 4, the organic EL layer 400 does not straddle the plurality of sub-pixels 210. Such the organic EL layer 400 is preferably formed, for example, by a method in which the raw material droplets of the organic EL layer 400 are selectively applied to the opening 230 surrounded by the rib 140 for each sub-pixel 210.

A second electrode 500 common to the plurality of pixels 200 is formed on the plurality of first electrodes 220. That is, the second electrode 500 is formed so as to straddle the plurality of first electrodes 220 of the plurality of pixels 200. The organic EL layer 400 is sandwiched between each first electrode 220 and the second electrode 500. Further, in the present embodiment, the second electrode 500 is formed as the cathode 18 (see FIG. 2).

In the present embodiment, since the display device 100 is a top emission type, the second electrode 500 is formed as a light transmitting electrode. That is, the second electrode 500 is preferably formed as a transparent electrode. The transparent electrode is formed using a transparent conductive material. As the transparent conductive material, for example, IZO (Indium Zinc Oxide) and/or ITO are preferably used. The second electrode 500 may be formed as a light-transmitting metal thin film electrode. The metal thin film electrode is preferably formed using, for example, AgMg.

In the display device 100, the OLED 6 (see FIG. 2) is composed of the first electrode 220, the organic EL layer 400, and the second electrode 500. That is, by passing a current between the first electrode 220 and the second electrode 500, the light emitting layer included in the organic EL layer 400 sandwiched between the first electrode 220 and the second electrode 500 is made to emit light.

As a result, in the display area 102 (see FIG. 1) of the display device 100, the opening 230 of each sub-pixel 210 emits light. Specifically, for example, in the pixel 200C shown in FIG. 3A, an opening 230R of the first sub-pixel 210R emits red light, an opening 230G of the second sub-pixel 210G emits green light, and an opening 230B of the third sub-pixel 210B emits blue light. The display device 100 can display a full-color image by emitting light of a plurality of colors.

Further, the display device 100 includes the routing wiring 300 formed in the same layer as the first electrode 220. Here, the fact that the routing wiring 300 is formed in the same layer as the first electrode 220 means that the routing wiring 300 is formed at the same time as the film formation of the first electrode 220. Therefore, for example, in the cross-sectional view of the display device 100, when the position of the upper surface of the base layer on which the routing wiring 300 is laminated and the position of the upper surface of the base layer on which the first electrode 220 is laminated deviate from each other, the position of the routing wiring 300 (for example, the position of the upper surface and/or the lower surface of the routing wiring 300) and the position of the first electrode 220 (for example, the position of the upper surface and/or the lower surface of the first electrode 220) may deviate from each other. The routing wiring 300 is used as the cathode power supply line. Therefore, the routing wiring 300 is supplied with a low potential applied to the second electrode 500 that is the cathode 18 (a potential that serves as a reference for the potential to be applied to the first electrode 220 that is the anode 16), or the routing wiring 300 is grounded.

Further, the routing wiring 300 is also electrically connected to the second electrode 500 as described later. As a result, the second electrode 500 is supplied with a potential that serves as a reference for the potential to be applied to the first electrode 220 via the routing wiring 300 (more specifically, an extension portion 330 of the routing wiring 300), or the second electrode 500 is grounded via the routing wiring 300.

As described above, the routing wiring 300 is formed at the same time as the formation of the first electrode 220 in the manufacturing process of the display device 100. Specifically, when the first electrode 220 is formed on the circuit layer 120, the routing wiring 300 is also formed. Therefore, in the present embodiment, the routing wiring 300 is made of the same material as the first electrode 220.

Then, the routing wiring 300 includes a line portion (a first line portion 310 or a second line portion 320) extending in a first direction between adjacent pixels 200 and the extension portion 330 extending in a second direction toward at least one first electrode 220 included in one of the adjacent pixels 200 from the line portion.

That is, in the examples shown in FIGS. 3A and 3B, the routing wiring 300 includes the first line portion 310 extending in the X direction in the drawing and the extension portion 330 extending from the first line portion 310 in the Y direction (the direction perpendicular to the X direction) in the drawing.

Specifically, the first line portion 310 extends in the X direction between the pixel 200C and the pixel 200Y2 that are adjacent to each other in the Y direction. On the other hand, the extension portion 330 extends in the Y direction from the first line portion 310 toward one first electrode 220R among the plurality of first electrodes 220R, 220G, and 220B included in the pixel 200C, which is one of the pixels 200C and 200Y2 adjacent to each other in the Y direction.

As a result, other first electrodes 220G and 220B included in the pixel 200C are arranged in the X direction of the extension portion 330. That is, the extension portion 330 extends from the first line portion 310 in the Y direction toward the first electrode 220R so that the other first electrodes 220G and 220B are arranged in the X direction thereof.

Further, in the examples shown in FIGS. 3A and 3B, the routing wiring 300 includes the second line portion 320 extending in the Y direction in addition to the first line portion 310 extending in the X direction. The second line portion 320 extends in the Y direction between the pixels 200C and the pixels 200X2 that are adjacent to each other in the X direction.

Then, the extension portion 330 extends in the X direction from the second line portion 320 toward one first electrode 220G among the plurality of first electrodes 220R, 220G, and 220B included in the pixel 200C, which is one of the pixels 200C and 200X2 adjacent to each other in the X direction.

As a result, another first electrode 220R included in the pixel 200C is arranged in the Y direction of the extension portion 330. That is, the extension portion 330 extends from the second line portion 320 toward the first electrode 220G in the X direction so that the other first electrode 220R is arranged in the Y direction thereof.

Then, as shown in FIG. 4, a part (first portion) 510 of the second electrode 500 is in physical contact with the extension portion 330 of the routing wiring 300 to be electrically connected to the routing wiring 300.

That is, the second electrode 500 physically contacts the extension portion 330 of the routing wiring 300 extending toward the first electrode 220 included in the pixel 200C at the first portion 510 extending from above a rib 142 (see FIG. 4) between the pixel 200C and the pixel 200Y2 adjacent to each other in the Y direction toward the pixel 200C, which is one of the pixel 200C and the pixel 200Y2. Specifically, as shown in FIG. 4, the first portion 510 of the second electrode 500 is in direct contact with the upper surface 330b of the extension portion 330.

Further, among the extension portions 330 extending from the first line portion 310 toward the first electrode 220, an opening 240 in which the rib 140 formed between the extension portion 330 and the first electrode 220 and the rib 142 formed on the extension portion 33 (see FIGS. 3A and 4) are not formed is formed between the rib 140 and the rib 142. Then, within the range of the opening 240, the second electrode 500 and the extension portion 330 are in physical contact with each other.

As described above, since the electrical connection between the second electrode 500 and the routing wiring 300 is made via the extension portion 330 of the routing wiring 300, the line portions 310 and 320 of the routing wiring 300 do not need to make physical contact with the second electrode 500, and in fact, in the present embodiment, the line portions 310 and 320 are not in physical contact with the second electrode 500 between the adjacent pixels 200.

Therefore, the line portions 310 and 320 of the routing wiring 300 can be formed as thin conductive lines having the minimum necessary width. Therefore, the occurrence of shading is effectively reduced by electrically connecting the second electrode 500 and the routing wiring 300 in the same layer as the first electrode 220 without excessively increasing the spacing between the adjacent pixels 200.

Further, in the example shown in FIG. 3B, a length Ly in the Y direction of the extension portion 330 extending in the Y direction from the first line portion 310 is larger than a width W1 of the first line portion 310 (that is, the length of the first line portion 310 in the Y direction). Similarly, a length Lx in the X direction of the extension portion 330 extending in the X direction from the second line portion 320 is larger than a width W2 of the second line portion 320 (that is, the length of the second line portion 320 in the X direction).

Further, in the example shown in FIG. 3B, the length Lx in the X direction of the extension portion 330 extending in the Y direction from the first line portion 310 is larger than the width W1 of the first line portion 310. Similarly, the length Ly in the Y direction of the extension portion 330 extending in the X direction from the second line portion 320 is larger than the width W2 of the second line portion 320.

By forming the extension portion 330 having a relatively large area in this way, the physical contact between the extension portion 330 and the second electrode 500 (specifically, the first portion 510 of the second electrode 500) is effectively performed.

The shape and arrangement of the first electrode 220 and the routing wiring 300 are not limited to the examples shown in FIGS. 3A and 3B, and can be appropriately designed within the range in which the effects of the present invention can be obtained.

That is, for example, in the example shown in FIG. 3A, the first electrodes 220R, 220G, and 220B are formed in an arrangement to be electrically connected to the TFTs (for example, the lighting TFT 10 and the drive TFT 12 (see FIG. 2)) formed corresponding to the first electrodes 220R, 220G, and 220B in the circuit layer 120 via the contact holes 40R, 40G, and 40B formed in the circuit layer 120 (see FIG. 4) below the first electrodes 220R, 220G, and 220B.

However, the first electrode 220 is not limited to the example shown in FIG. 3A as long as the first electrode 220 can be electrically connected to the TFT in the circuit layer 120 via the contact hole 40 and may be formed in another shape or arrangement.

Further, the routing wiring 300 is not limited to the example shown in FIG. 3A as long as the routing wiring 300 can be electrically connected to the second electrode 500 via the extension portion 330 as described above, and may be formed in another shape and arrangement.

That is, for example, the routing wiring 300 may include only one of the first line portion 310 extending in the X direction and the second line portion 320 extending in the Y direction. Specifically, as shown in FIG. 3C, the routing wiring 300 may include the first line portion 310 extending in the X direction and the extension portion 330 extending in the Y direction from the first line portion 310.

Figure 3C:
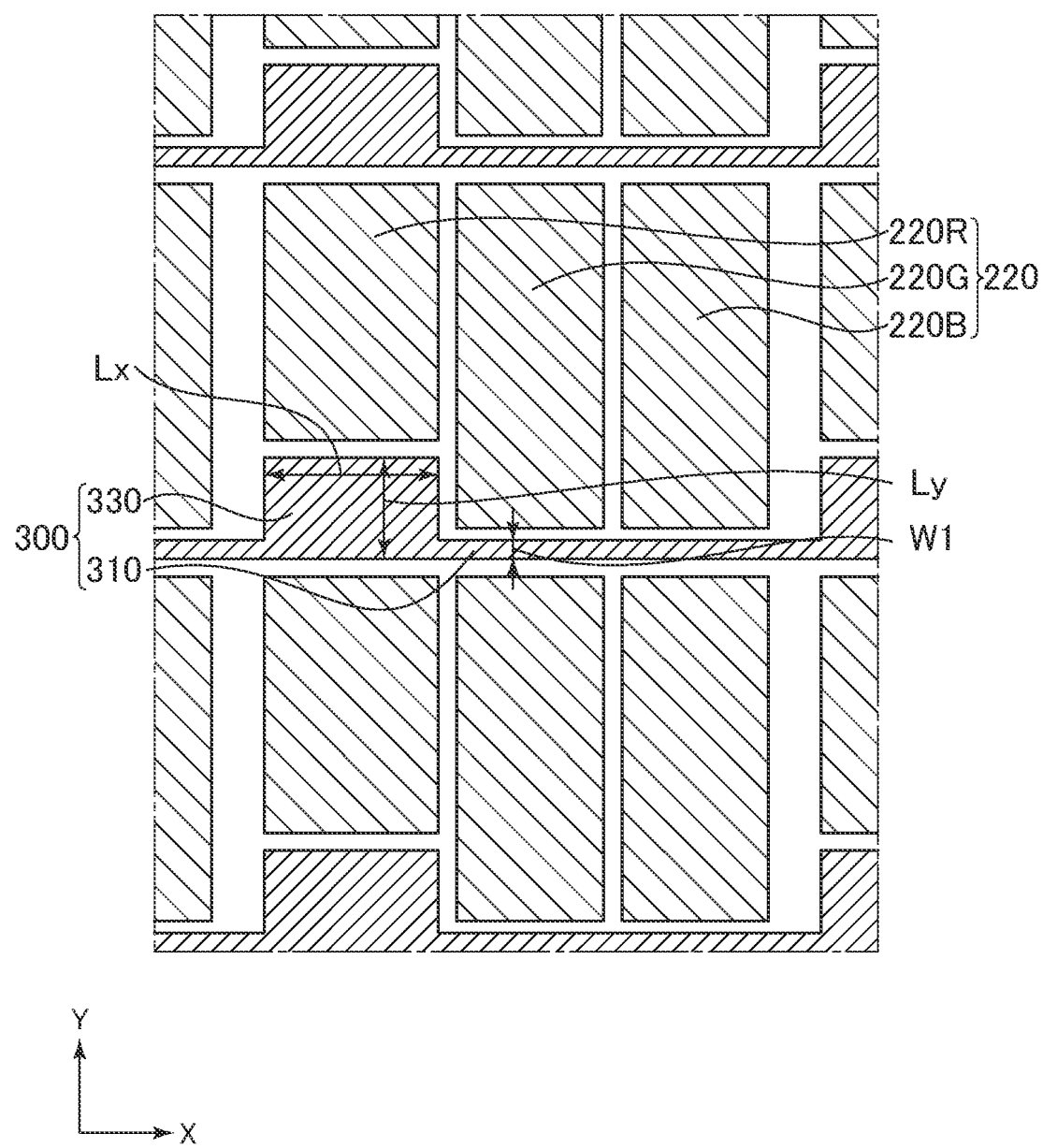
FIG. 3C is a schematic diagram schematically showing a plan view by extracting another example of the shape and arrangement of the first electrode and the routing wiring in the display area of the display device according to the embodiment of the present invention.

In the example of FIG. 3C, the extension portion 330 extends in the Y direction from the first line portion 310 toward the first electrode 220R included in the pixel 200C. As a result, other first electrodes 220G and 220B are arranged in the X direction of the extension portion 330.

Further, for example, in the first direction of the extension portion 330 extending from the first line portion 310 extending in the first direction toward at least one first electrode 220 included in one pixel 200, another one first electrode 220 included in the one pixel 200 may be arranged, or a plurality of other first electrodes 220 included in the one pixel 200 (provided that the number of first electrodes 220 is less than the total number of first electrodes 220 included in the pixel 200) may be arranged.

Figure 3D:
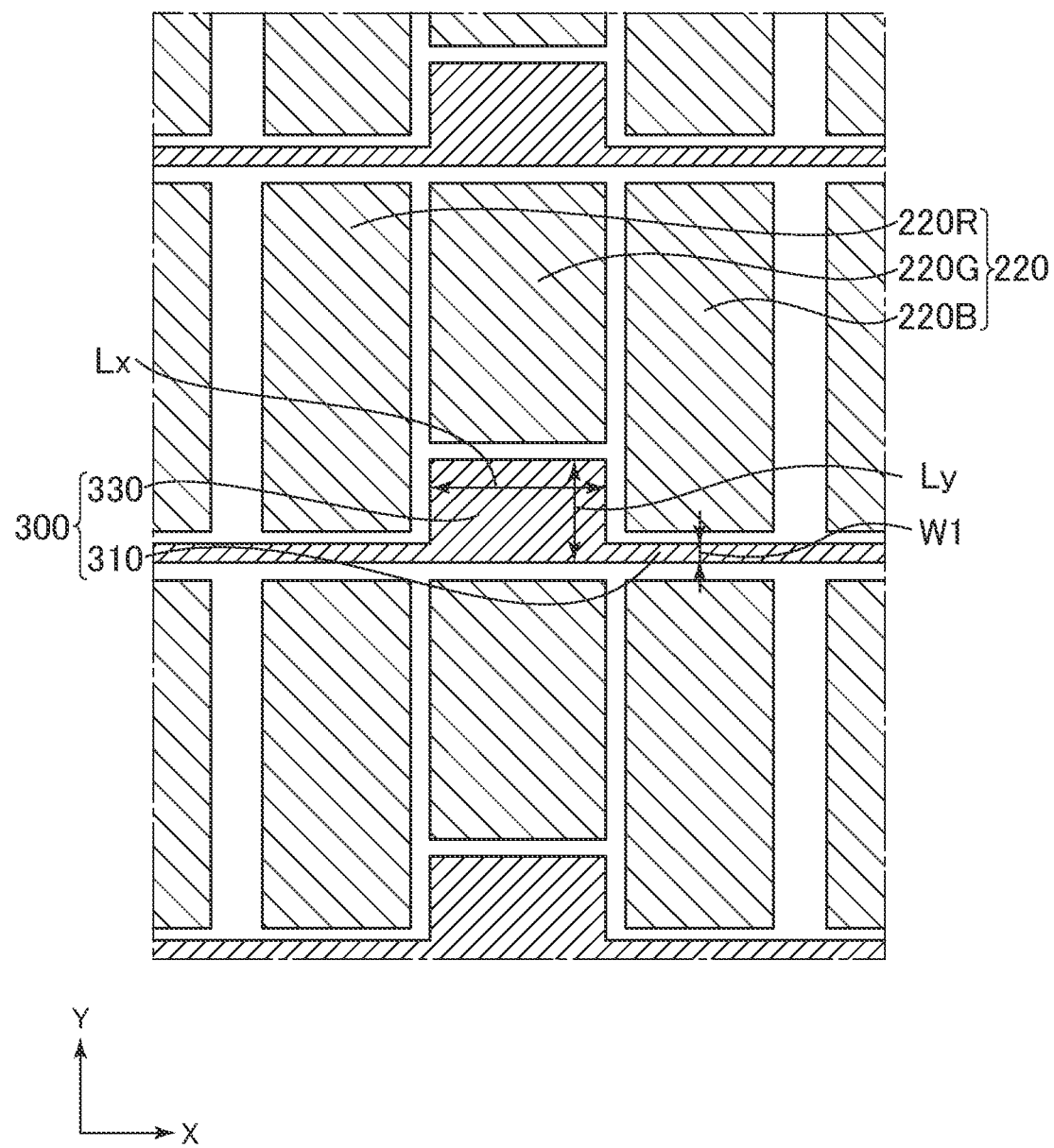
FIG. 3D is a schematic diagram schematically showing a plan view by extracting another example of the shape and arrangement of the first electrode and the routing wiring in the display area of the display device according to the embodiment of the present invention.

That is, as shown in FIG. 3D, the routing wiring 300 includes the extension portion 330 extending in the Y direction from the first line portion 310 extending in the X direction toward one first electrode 220G among the three first electrodes 220R, 220G, and 220B included in the pixel 200C, and the other two first electrodes 220R and 220B are arranged in the X direction of the extension portion 330. Specifically, in the example shown in FIG. 3D, another one first electrode 220B is arranged on one side of the extension portion 330 in the X direction, and yet another one first electrode 220R is arranged on the other side thereof in the X direction.

Further, for example, the extension portion 330 of the routing wiring 300 may extend toward only one first electrode 220 among the plurality of first electrodes 220 included in one pixel 200 or may extend toward a plurality of first electrodes 220 included in the pixel 200 (provided that the number of first electrodes 220 is less than the total number of first electrodes 220 included in the pixel 220).

Figure 3E:
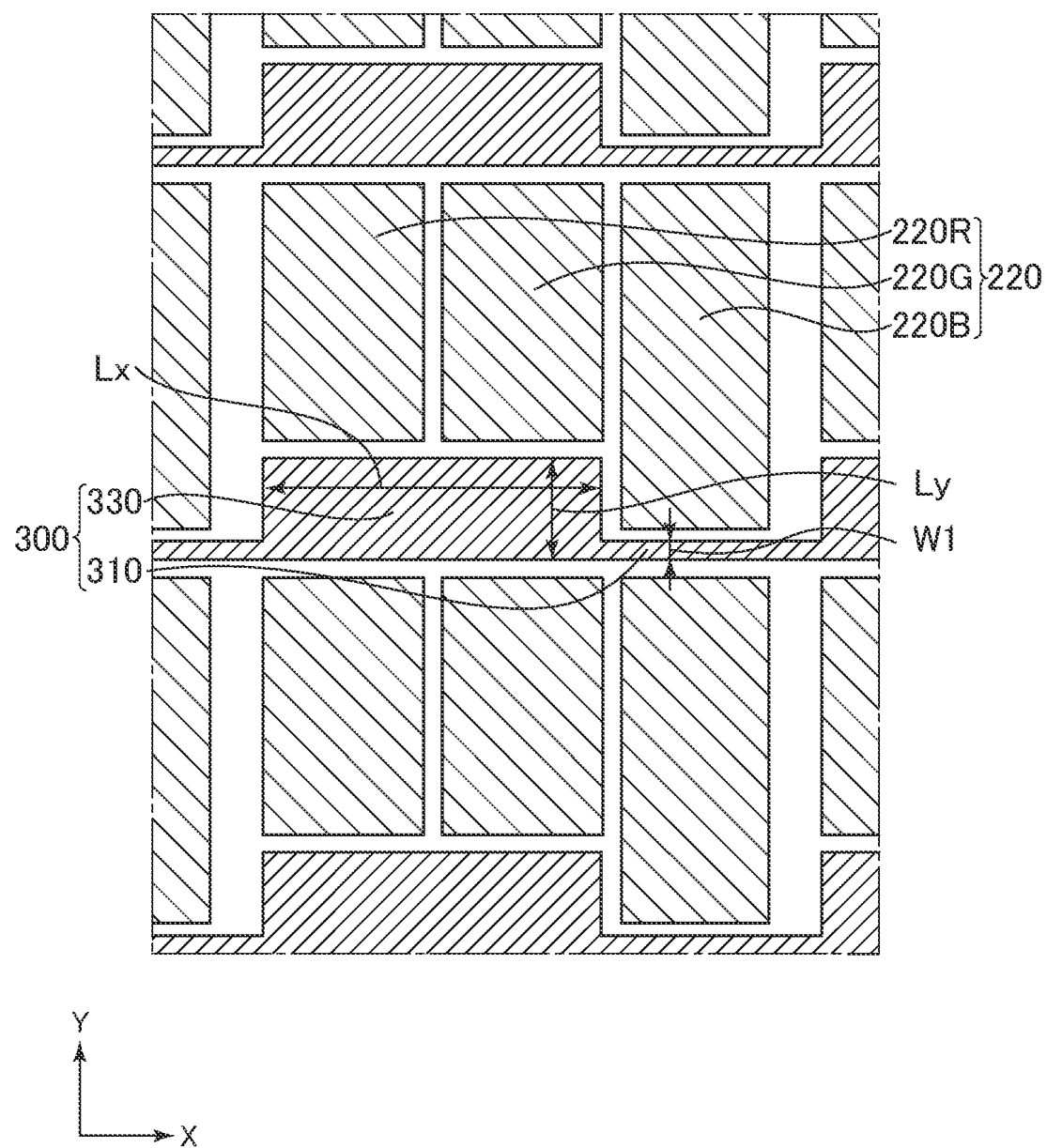
FIG. 3E is a schematic diagram schematically showing a plan view by extracting still another example of the shape and arrangement of the first electrode and the routing wiring in the display area of the display device according to the embodiment of the present invention.

That is, for example, as shown in FIG. 3E, the extension portion 330 may extend from the first line portion 310 extending in the X direction not only toward the one first electrode 220R included in the pixel 200C but also toward another one first electrode 220G in the Y direction. In this case, the remaining one first electrode 220B is arranged on the X-direction side of the extension portion 330.

Further, since the routing wiring 300 is formed in the same layer as the first electrode 220, in the manufacture of the display device 100, it is possible to realize the first electrode 220 and the routing wiring 300 having any shapes and arrangements simply by designing one layer formed on the circuit layer 120. Therefore, for example, the circuit layer designed for other conventional display devices can be used as it is.

Figure 6:
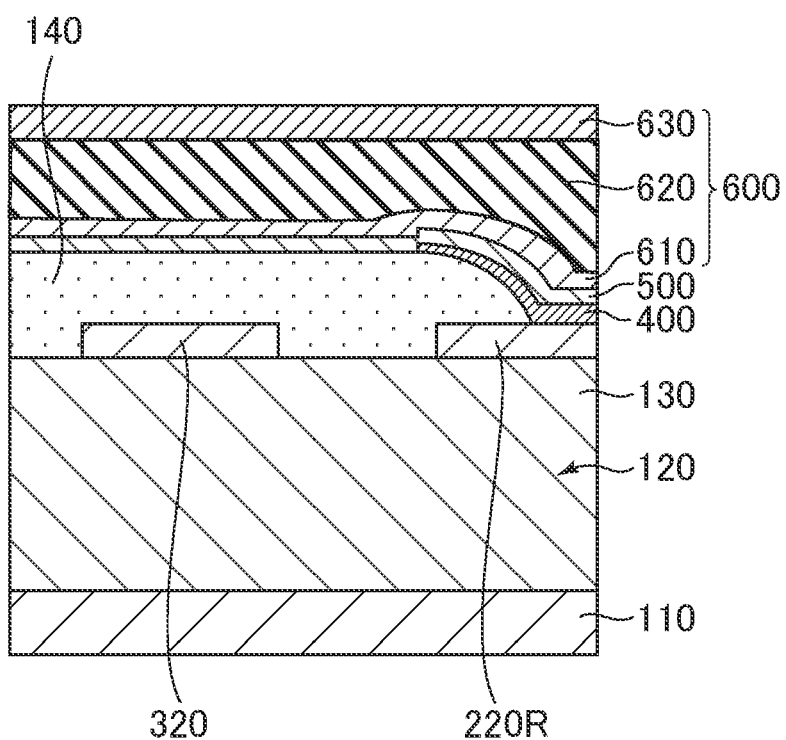
FIG. 6 is a schematic diagram schematically showing a cross section of the display device cut along the VI-VI line shown in FIG. 3A.

In the present embodiment, the display device 100 further includes a sealing film 600 formed on the second electrode 500 (see FIGS. 4 and 6). The sealing film 600 is formed over the plurality of pixels 200. That is, in the present embodiment, the sealing film 600 is formed so as to cover the second electrode 500 and the layer thereunder in the entire display area 102 (see FIG. 1).

The sealing film 600 is formed to prevent the invasion of water into the organic EL layer 400 from the outside. Therefore, as shown in FIG. 4, the sealing film 600 includes an inorganic film (a lower layer inorganic film 610, and an upper layer inorganic film 630). The inorganic films 610 and 630 are formed of an inorganic material that does not allow moisture to permeate. As such an inorganic material, for example, an inorganic compound containing nitrogen and silicon (for example, one or more selected from the group consisting of SiN (for example, $Si_3N_4$), SiCN, and SiON) is preferably used.

In the example shown in FIG. 4, the sealing film 600 includes the lower layer inorganic film 610 formed on the second electrode 500, an organic film 620 formed on the lower layer inorganic film 610, and the upper layer inorganic film 630 formed on the organic film 620.

The lower layer inorganic film 610 constitutes the lowermost layer of the sealing film 600. Further, the upper layer inorganic film 630 constitutes the uppermost layer of the sealing film 600. The organic film 620 is arranged between the lower layer inorganic film 610 and the upper layer inorganic film 630. The inorganic material constituting the lower layer inorganic film 610 and the inorganic material constituting the upper layer inorganic film 630 may be the same or different. The organic film 620 is formed of an organic material. As the organic material, for example, a resin material such as acrylic or epoxy is preferably used.

On the other hand, as shown in FIG. 4, the uppermost portion of the circuit layer 120 is composed of an organic layer 130, and the first electrode 220 and the routing wiring 300 are formed on the organic layer 130. A groove portion 132 is formed in the organic layer 130 between the extension portion 330 of the routing wiring 300 and the first electrode 220 adjacent to the extension portion 330.

That is, in the example shown in FIG. 4, the groove portion 132 as a recess is formed in the organic layer 130 between the extension portion 330 extending toward the first electrode 220R, and the first electrode 220R. The groove portion 132 is formed, for example, by scraping a part of a surface 134 of the organic layer 130 between the extension portion 330 and the first electrode 220R by etching or the like in the manufacturing process of the display device 100. More specifically, for example, when etching the rib 140 formed on the organic layer 130, a part of the organic layer 130 is also scraped at the same time, and thus, the groove portion 132 is formed in that part.

In the groove portion 132, among the second electrode 500, the first portion 510 that is in physical contact with the extension portion 330 is physically cut off from another one portion (second portion) 520 formed on the first electrode 220R adjacent to the extension portion 330.

That is, in the example shown in FIG. 4, of the second electrode 500, yet another one portion (third portion) 530 extending from the second portion 520 formed on the first electrode 220R toward the extension portion 330 and formed in the groove portion 132 is physically cut off from the first portion 510 formed on the extension portion 330.

As a result, the first portion 510 of the second electrode 500 is physically cut off from the second portion 520 and the third portion 530. However, since the second electrode 500 is formed as the common electrode straddling the plurality of pixels 200, the first portion 510 of the second electrode 500, and the second portion 520 and the third portion 530 are integrally formed and are electrically connected to each other.

Then, an end surface 330a of the extension portion 330 of the routing wiring 300 facing the first electrode 220R adjacent to the extension portion 330 and an end surface 510a of the first portion 510 of the second electrode 500 facing the first electrode 220R are in physical contact with the sealing film 600, respectively.

That is, in the example shown in FIG. 4, the end surface 330a of the extension portion 330 facing the first electrode 220R and the end surface 510a of the first portion 510 of the second electrode 500 facing the first electrode 220R are continuous from the bottom to the top in this order, and these continuous end surfaces 510a and 330a are in physical contact with the sealing film 600 (more specifically, the lower layer inorganic film 610 of the sealing film 600).

As a result, the second electrode 500 physically contacts the sealing film 600 not only on an upper surface 510b of the first portion 510 but also on the end surface 510a, and thus, the adhesion area with the sealing film 600 increases. Further, since adhesion between the routing wiring 300 and the sealing film 600 is also formed, the adhesion between them is effectively enhanced.

Further, in the example shown in FIG. 4, of the second electrode 500, the third portion 530 extending from above the first electrode 220R formed in the extending direction of the extension portion 330 of the routing wiring 300 toward the extension portion 330, and formed in the groove portion 132 is formed below the extension portion 330.

As a result, among surfaces 132a, 132b, and 132c of the groove portion 132, the surface 132a facing the first electrode 220R is also in physical contact with the sealing film 600. That is, the surface 132a of the groove portion 132 of the organic layer 130, the end surface 330a of the extension portion 330, and the end surface 510a of the first portion 510 of the second electrode 500 are continuous from the bottom to the top in this order, and these continuous surfaces 510a, 330a, and 132a are all in physical contact with the sealing film 600. As a result, the adhesion of the second electrode 500, the routing wiring 300, and the organic layer 130 is effectively enhanced.

As shown in FIG. 4, the sealing film 600 (more specifically, the lower layer inorganic film 610 of the sealing film 600) continuously straddles the first portion 510, the third portion 530, and the second portion 520 of the second electrode 500 to cover these portions 510, 520, and 530.

Further, the third portion 530 of the second electrode 500 is in physical contact with the organic layer 130 (more specifically, the surface 132a of the groove portion 132 of the organic layer 130) at the end surface 530a on the extension portion 330 side and is in physical contact with the sealing film 600 at an upper surface 530b.

Further, the organic EL layer 400 is not formed in the groove portion 132. That is, the organic EL layer 400 is not formed between the surfaces 132a, 132b, and 132c of the groove portion 132, and the third portion 530 of the second electrode 500. Then, in the groove portion 132, a part 612 of the lower layer inorganic film 610 is formed on the third portion 530 of the second electrode 500. In the example shown in FIG. 4, a surface (the surface facing the extension portion 330) 612a of the part 612 of the lower layer inorganic film 610, the surface 132a of the groove portion 132, the end surface 330a of the extension portion 330, and the end surface 510a of the first portion 510 of the second electrode 500 are in contact with each other.

Further, in FIG. 4, the groove portion 132 is formed between the extension portion 330 of the routing wiring 300 and the first electrode 220R arranged in the Y direction in which the extension portion 330 extends from the first line portion 310. However, for example, a groove portion and a surrounding structure thereof similar to those in the above example may be formed between the extension portion 330 and the first electrode 220G (see FIG. 3A) arranged in the X direction in which the extension portion 330 extends from the second line portion 320.

Figure 5A:
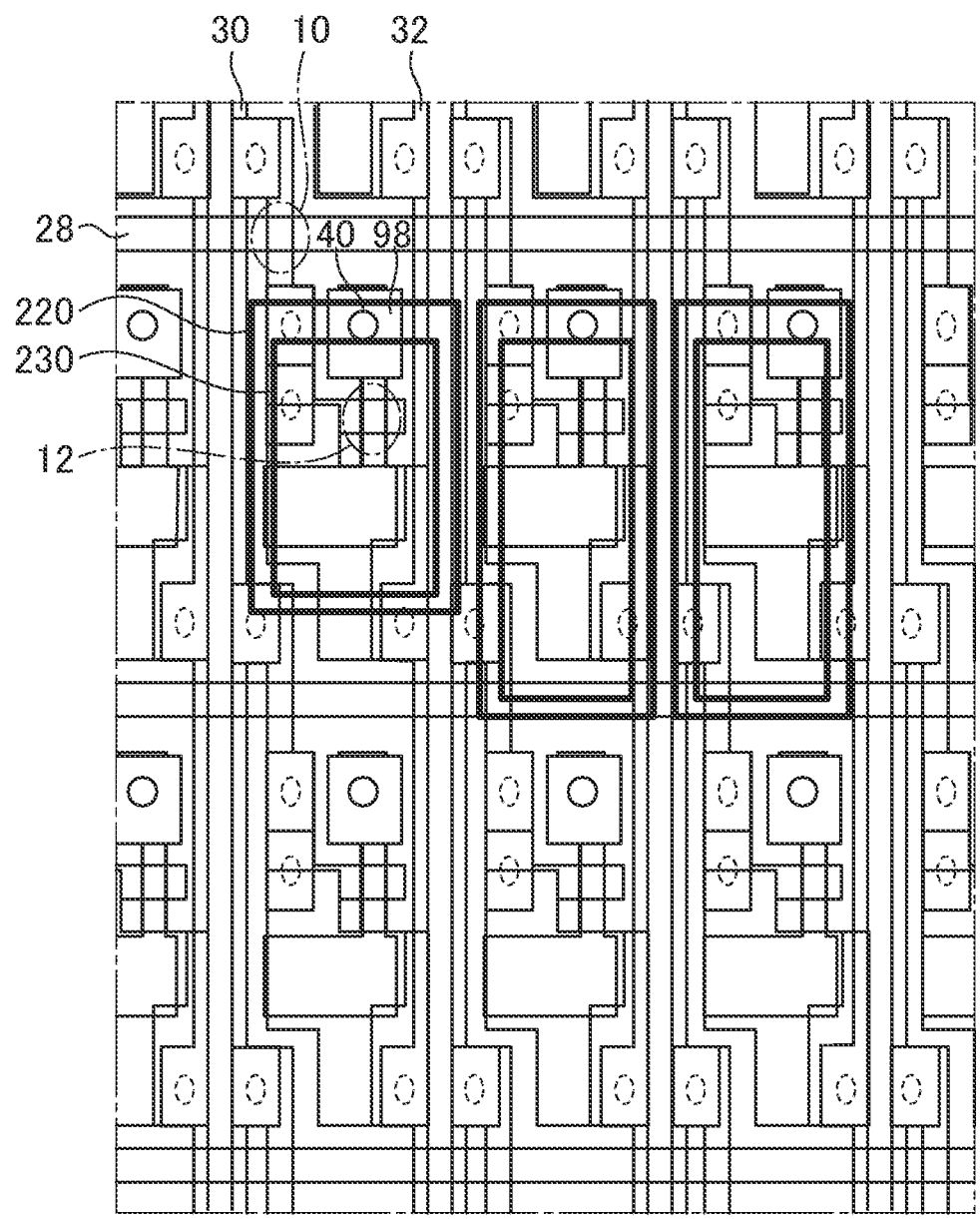
FIG. 5A is a schematic diagram schematically showing a positional relationship between a pixel circuit and a first electrode in the display device according to the embodiment of the present invention in a plan view.
Figure 5B:
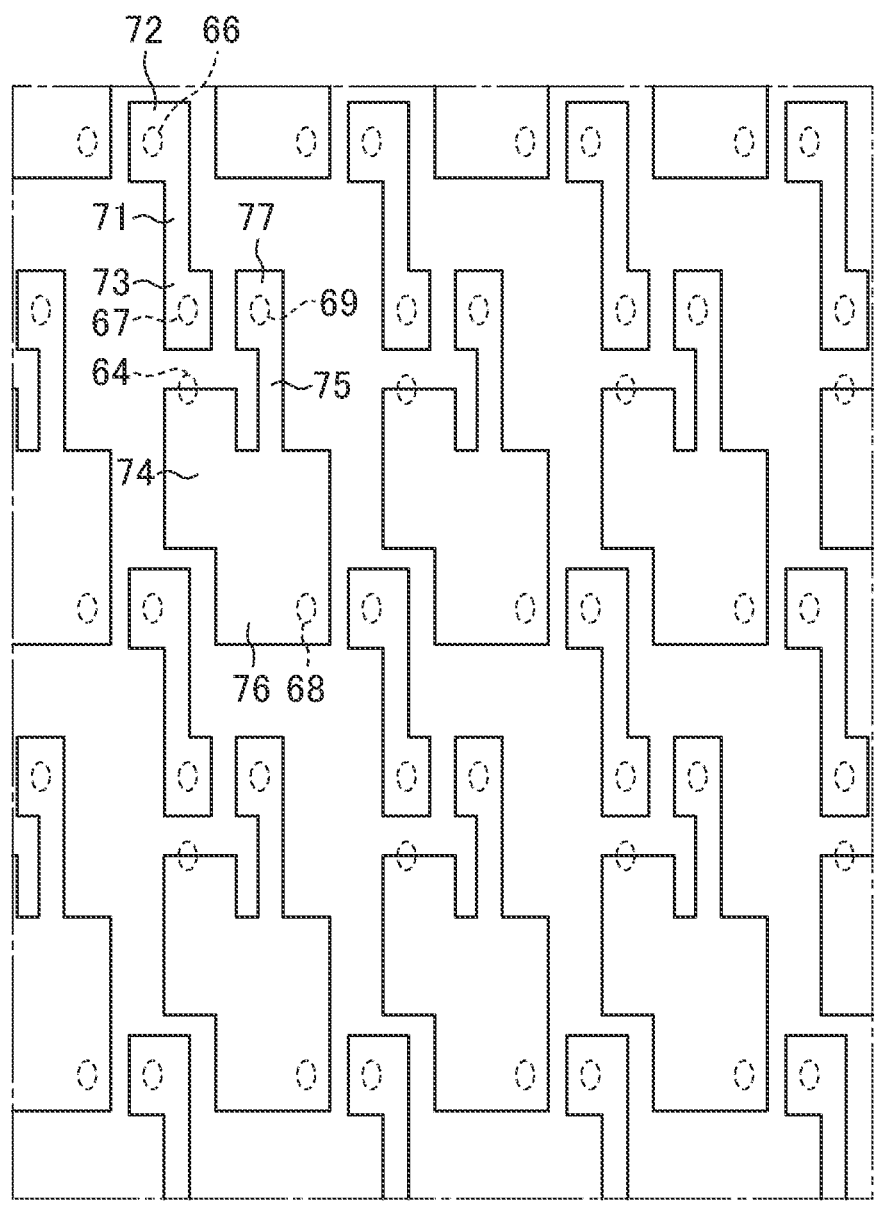
FIG. 5B is a schematic diagram schematically showing a part of a plurality of layers constituting the pixel circuit shown in FIG. 5A in a plan view.
Figure 5C:
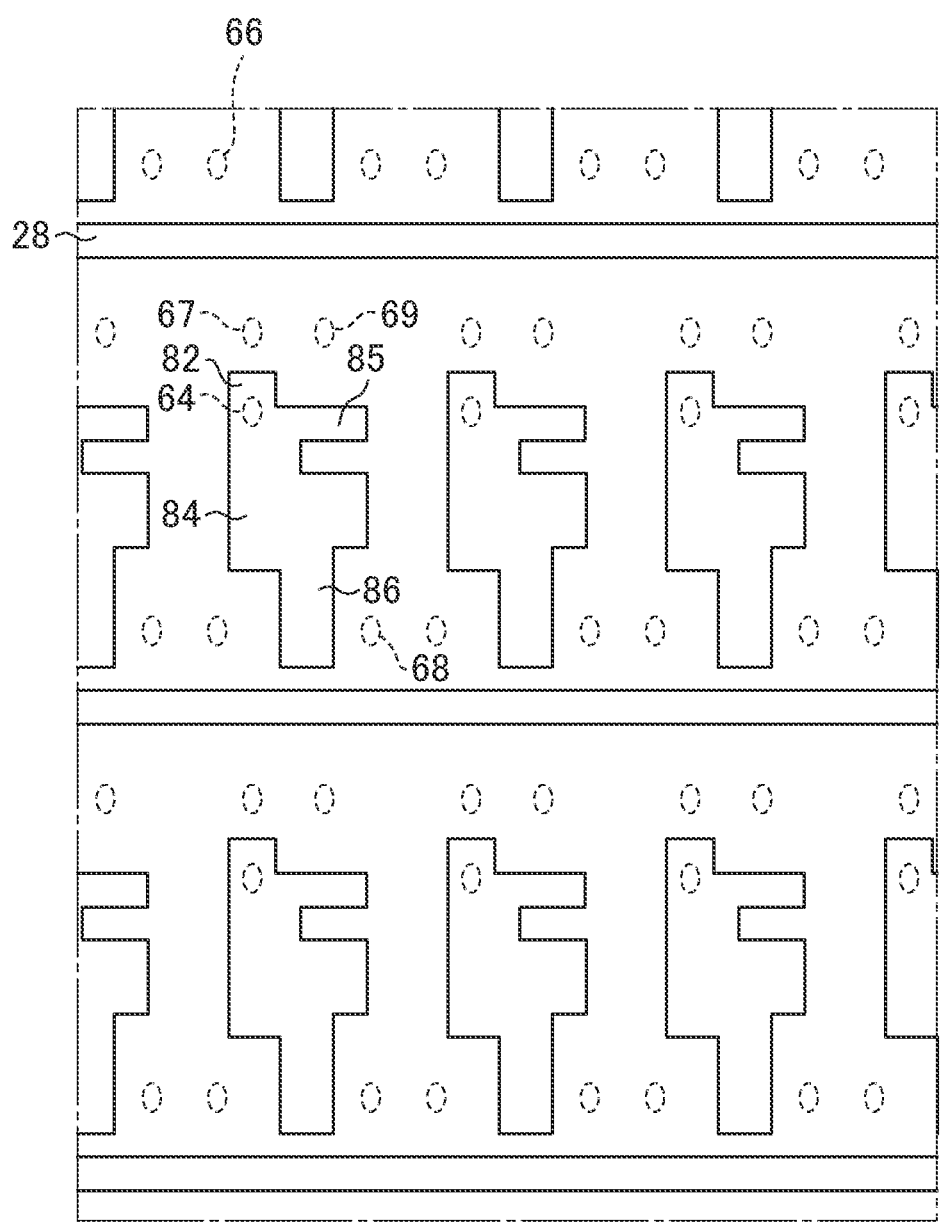
FIG. 5C is a schematic diagram schematically showing another part of the plurality of layers constituting the pixel circuit shown in FIG. 5A in a plan view.

FIG. 5A is a plan view showing a specific example of the pixel circuit 8 (see FIG. 2). FIGS. 5B to 5F are diagrams showing one or more layers constituting the pixel circuit shown in FIG. 5A. FIG. 5B is a plan view showing an example of the semiconductor layer. FIG. 5C is a plan view showing an example of the gate layer. 5D is a plan view showing the semiconductor layer of FIG. 5B and the gate layer of FIG. 5C in an overlapping manner. FIG. 5E is a plan view showing an example of a signal line and power supply line layer. FIG. 5F is a plan view showing the first electrode 220 superimposed on the signal line and power supply line layer of FIG. 5E.

As shown in FIGS. 2 and 5A, the pixel circuit 8 includes the lighting TFT 10, the drive TFT 12, and the capacitor 14, and is connected to the scanning signal line 28, the video signal line 30, and the drive power supply line 32. Then, as shown in FIG. 5A, the first electrode 220 is formed on the circuit layer 120 including the plurality of layers shown in FIGS. 5B to 5F.

As shown in FIG. 5B, the semiconductor layer includes a channel portion 71. Pad portions 72 and 73 are provided at both end portions of the channel portion 71, respectively. Contact holes 66 and 67 are formed at the positions of the pad portions 72 and 73, respectively.

Further, the semiconductor layer includes a capacitance portion 74 and a channel portion 75 integrally formed. Pad portions 76 and 77 are provided at both end portions of the capacitance portion 74 and the channel portion 75, respectively. Contact holes 68 and 69 are formed at the positions of the pad portions 76 and 77, respectively.

As shown in FIG. 5C, the gate layer formed on the semiconductor layer includes the scanning signal line 28. Further, the gate layer includes a pad portion 82, a capacitance portion 84, a gate portion 85, and a capacitance portion 86 that are integrally formed. A contact hole 64 is formed in the pad portion 82. The capacitance portion 84 of the gate layer is provided so as not to overlap with the channel portion 71 of the semiconductor layer in a plan view.

Figure 5D:
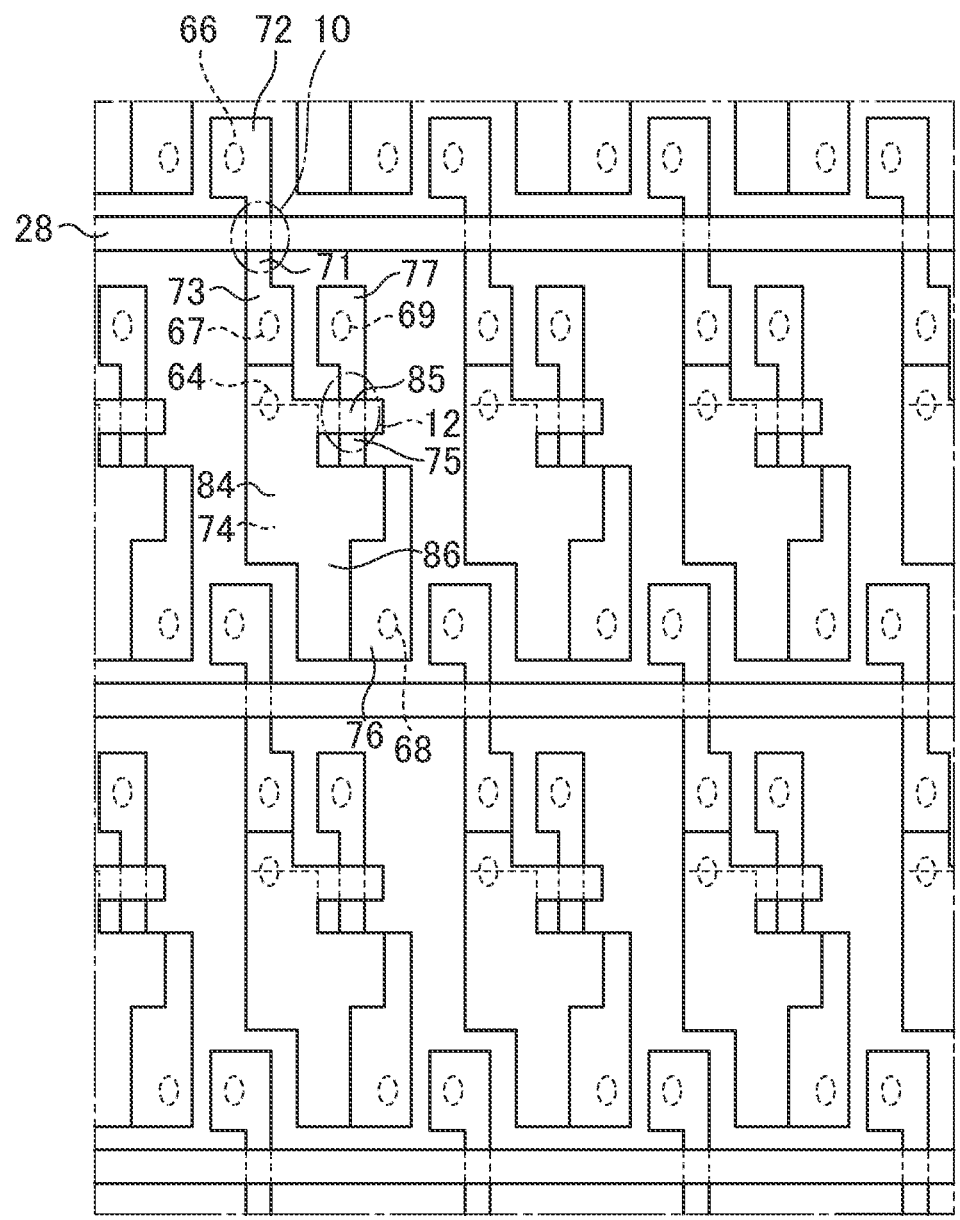
FIG. 5D is a schematic diagram schematically showing the positional relationship between the layer shown in FIG. 5B and the layer shown in FIG. 5C in a plan view.
Figure 5E:
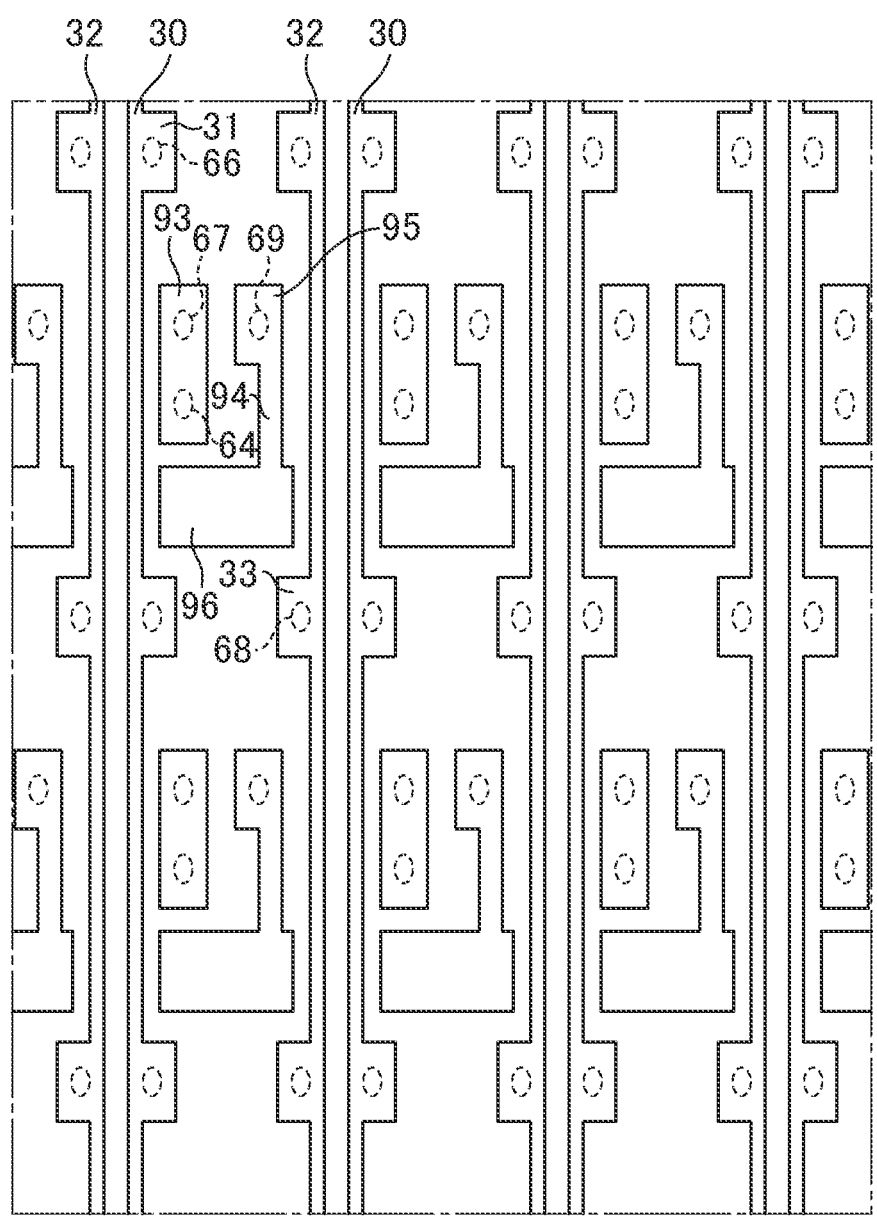
FIG. 5E is a schematic diagram schematically showing another layer among the plurality of layers constituting the pixel circuit shown in FIG. 5A in a plan view.
Figure 5F:
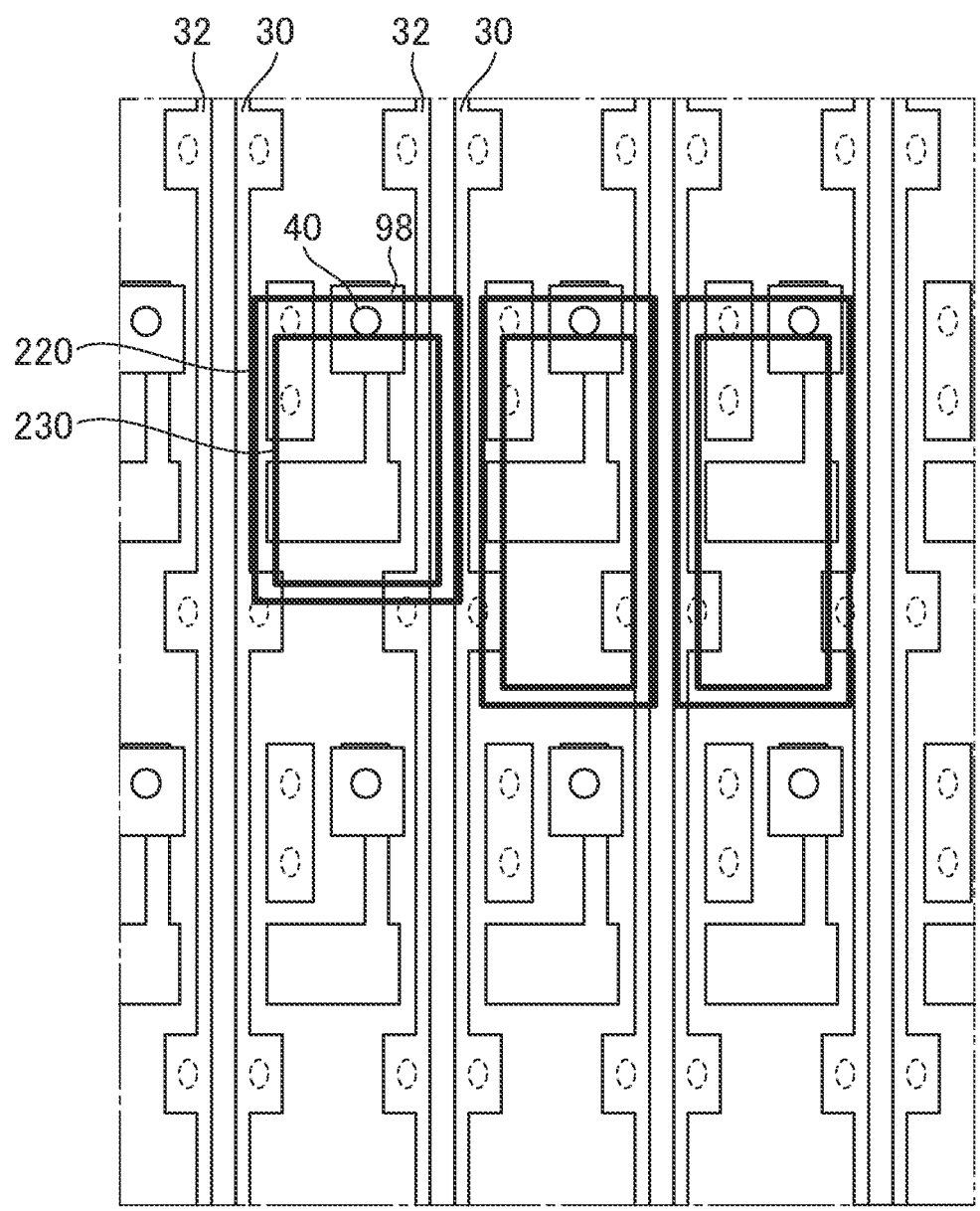
FIG. 5F is a schematic diagram schematically showing the positional relationship between the layer shown in FIG. 5E and the first electrode in a plan view.

As shown in FIG. 5D, the channel portion 71 of the semiconductor layer and the scanning signal line 28 of the gate layer overlap in a plan view, and these constitute the lighting TFT 10 (see FIG. 2). Further, the channel portion 75 of the semiconductor layer and the gate portion 85 of the gate layer overlap in a plan view, and these form the drive TFT 12 (see FIG. 2). Further, the capacitance portion 74 of the semiconductor layer and the capacitance portions 84 and 86 of the gate layer overlap in a plan view, and these form the capacitor 14 (see FIG. 2).

As shown in FIG. 5E, the signal line and power supply line layer formed on the gate layer includes the drive power supply line 32 and a pad portion 33 provided on the drive power supply line 32. The drive power supply line 32 is connected to the pad portion 76 and the capacitance portion 74 (see FIG. 5B) of the semiconductor layer through the contact hole 68 of the pad portion 33.

The signal line and power supply line layer includes the video signal line 30 and a pad portion 31 provided on the video signal line 30. The video signal line 30 is connected to the pad portion 72 (see FIG. 5B) of the semiconductor layer through the contact hole 66 of the pad portion 31.

Further, the signal line and power supply line layer includes a connecting portion 93. The connecting portion 93 is formed so as to include the entire contact holes 64 and 67 in a plan view. The connecting portion 93 is connected to the pad portion 73 of the semiconductor layer (see FIG. 5B) through the contact hole 67, and connected to the pad portion 82 (see FIG. 5C) provided integrally with the capacitance portions 84 and 86 and the gate portion 85 of the gate layer through the contact hole 64. As a result, the pad portion 73 of the semiconductor layer and the capacitance portion 84 of the gate layer are electrically connected via the connecting portion 93.

That is, the lighting TFT 10 and the drive TFT 12 (see FIG. 5A) are connected to each other via the connecting portion 93 formed inside the contact holes 64 and 67. More specifically, one of the channel portion 71 (see FIG. 5B) of the lighting TFT 10 (that is, one of the source electrode and the drain electrode) is connected to the video signal line 28, and the other is connected to the gate portion 85 of the drive TFT 12 and the capacitance portions 84 and 86 of the capacitor 14.

Further, the signal line and power supply line layer includes a wiring portion 94. Pad portions 95 and 96 are provided at both ends of the wiring portion 94, respectively. The pad portion 95 provided in the wiring portion 94 is connected to the pad portion 77 (see FIG. 5B) of the semiconductor layer through the contact hole 69.

As shown in FIG. 5F, the first electrode 220 is provided on the signal line and power supply line layer. Specifically, a connection electrode 98 is formed on the pad portion 95 of the signal line and power supply line layer, the pad portion 95 and the connection electrode 98 are connected through the contact hole 40, and the first electrode 220 is connected to the connection electrode 98. The opening 230 that exposes the first electrode 220 is formed inside the first electrode 220 in a plan view.

FIG. 6 is a schematic diagram schematically showing a cross section of the display device 100 cut along the VI-VI line shown in FIG. 3A. As shown in FIG. 6, the first electrode 220R and the second line portion 320 of the routing wiring 300 are formed in the same layer on the circuit layer 120. That is, in addition to the extension portion 330 of the routing wiring 300, the line portions 310 and 320 (see FIGS. 3A to 3E) are also formed in the same layer as the first electrode 200.

The organic EL layer 400 is formed on the first electrode 220R from the central portion where the rib 140 is not formed to a part of the rib 140. Further, the rib 140 is formed from the outer peripheral portion of the first electrode 220R to the top of the second line portion 320 of the routing wiring 300.

The organic EL layer 400 is not formed on the second line portion 320 of the routing wiring 300. The second electrode 500 is formed on the first electrode 220R, the organic EL layer 400, and the second line portion 320. However, the second electrode 500 is not in physical contact with the second line portion 320 of the routing wiring 300. On the second electrode 500, the sealing film 600 including the lower layer inorganic film 610, the organic film 620, and the upper layer inorganic film 630 is formed.

In the present embodiment, an example in which the display device is an organic EL display device has been illustrated, but the display device according to the present invention is not limited thereto, and, for example, any flat panel type display device such as a self-luminous display device such as a liquid crystal display device, or an electronic paper type display device having electrophoresis element or the like may be used. Further, it is needless to say that the present invention can be applied to a display device of any size, from small to medium size to large size, without particular limitation.

In addition, among other effects brought about by the aspect described in the present embodiments, what is apparent from the description of the present specification or what can be appropriately conceived by those skilled in the art is naturally understood to be brought about by the present invention.

It is understood that those skilled in the art can come up with various examples of changes and modifications within the scope of the idea of the present invention, and these examples of changes and modifications also belong to the scope of the present invention. For example, with respect to each embodiment described above, addition, deletion, or design changes of constituent elements, or addition, omission, or changes in conditions of the process, which are appropriately performed by those skilled in the art, are also included in the scope of the present invention as long as they are within the gist of the present invention.

What is claimed is:

1. A display device comprising:
   a plurality of pixels each including a plurality of first electrodes;
   a second electrode formed on the plurality of first electrodes and common to the plurality of pixels;
   a routing wiring formed in the same layer as the first electrode; and
   a sealing film formed on the second electrode, wherein
   the routing wiring includes a line portion extending in a first direction between the adjacent pixel, and an extension portion extending in a second direction from the line portion toward at least one first electrode included in one of the adjacent pixels and in which the other first electrode of the one pixel is arranged in the first direction,
   a length of the extension portion in the second direction is larger than a width of the line portion,
   a part of the second electrode is in physical contact with the extension portion to be electrically connected to the routing wiring, and
   the plurality of first electrodes and the routing wiring are formed on an organic layer,
   a groove portion is formed in the organic layer between the extension portion of the routing wiring and the first electrode adjacent to the extension portion,
   in the groove portion, the part of the second electrode in physical contact with the extension portion and the other part thereof formed on the first electrode adjacent to the extension portion are physically cut off, and
   an end surface of the part of the second electrode and end surfaces of the extension portion of the routing wiring facing the first electrode adjacent to the extension portion, and the surface of the groove portion of the organic layer facing the first electrode adjacent to the extension portion are in physical contact with the sealing film.

2. A display device comprising:
   a plurality of pixels each including a plurality of first electrodes;
   a second electrode formed on the plurality of first electrodes and common to the plurality of pixels; and
   a routing wiring formed in the same layer as the first electrode,
   a sealing film formed on the second electrode, wherein
   the routing wiring includes a line portion extending in a first direction between the adjacent pixels, and an extension portion extending in a second direction from the line portion toward at least one first electrode included in one of the adjacent pixels and in which the other first electrode of the one pixel is arranged in the first direction, and
   a length of the extension portion in the first direction is larger than the width of the line portion,
   a part of the second electrode is in physical contact with the extension portion to be electrically connected to the routing wiring,
   the plurality of first electrodes and the routing wiring are formed on an organic layer, a groove portion is formed in the organic layer between the extension portion of the routing wiring and the first electrode adjacent to the extension portion,
   in the groove portion, the part of the second electrode in physical contact with the extension portion and the other part thereof formed on the first electrode adjacent to the extension portion are physically cut off, and
   an end surface of the part of the second electrode and end surfaces of the extension portion of the routing wiring facing the first electrode adjacent to the extension portion, and the surface of the groove portion of the organic layer facing the first electrode adjacent to the extension portion are in physical contact with the sealing film.

* * * * *